(12) United States Patent
Paulus (10) Patent No.: US 7,315,271 B2
(45) Date of Patent: Jan. 1, 2008

(54) ANALOG-TO-DIGITAL CONVERTER

(75) Inventor: Christian Paulus, Weilheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/536,764

(22) PCT Filed: Oct. 29, 2003

(86) PCT No.: PCT/DE03/03606

§ 371 (c)(1),
(2), (4) Date: Dec. 21, 2005

(87) PCT Pub. No.: WO2004/051859

PCT Pub. Date: Jun. 17, 2004

(65) Prior Publication Data

US 2006/0152397 A1    Jul. 13, 2006

(30) Foreign Application Priority Data

Nov. 29, 2002 (DE) ............................... 102 55 915

(51) Int. Cl.
*H03M 1/34* (2006.01)
(52) U.S. Cl. .................. 341/158; 341/154; 341/155; 341/159
(58) Field of Classification Search ............... 341/154, 341/158, 159
See application file for complete search history.

(56) References Cited

U.S. PATENT DOCUMENTS 5,160,930 A * 11/1992 Hosotani et al. ........... 341/154
5,231,399 A * 7/1993 Gorman et al. ............. 341/159
5,598,161 A * 1/1997 Yamada ...................... 341/159
5,798,725 A * 8/1998 Okada ........................ 341/158
5,815,106 A * 9/1998 Poss et al. .................. 341/159
6,114,982 A   9/2000 Hardy et al.
6,437,724 B1  8/2002 Nagaraj
6,480,134 B1* 11/2002 Sasaki ........................ 341/159
6,882,294 B2* 4/2005 Linder et al. ............... 341/154

FOREIGN PATENT DOCUMENTS

| EP | 0 729 233 | 8/1996 |
| GB | 2 187 054 | 8/1987 |
| JP | 07254857 | 10/1995 |

OTHER PUBLICATIONS

Graeme et al., "Operational Ampliflers/Design and Applications," McGraw-Hill International, New York, pp. 358-369 (1971).

* cited by examiner

*Primary Examiner*—Khai M. Nguyen
(74) *Attorney, Agent, or Firm*—Dicke, Billig & Czaja, PLLC (57) ABSTRACT

The invention relates to an analog-to-digital converter. The analog-to-digital converter, for conversion of a signal for digitization into a digital signal, contains a number of comparators, each of which has a first and second input and an output. The digitized signal is provided at said output. Each comparator is further provided with an impedance network, coupled to at least one input of the comparator, whereby an impedance network is wired between the corresponding comparator and the signal for digitization and between the corresponding comparator and a first electrical reference potential. The impedance networks are arranged such that the comparators are essentially brought to the same working point in the region of the specific decision threshold thereof.

21 Claims, 9 Drawing Sheets

|   | Rin: | 1600 |
|---|---|---|
| i | Rgndi | Rrefi |
| 1 | 1653 | 49600 |
| 2 | 1710 | 24800 |
| 3 | 1771 | 16533 |
| 4 | 1837 | 12400 |
| 5 | 1908 | 9920 |
| 6 | 1984 | 8267 |
| 7 | 2067 | 7086 |
| 8 | 2157 | 6200 |
| 9 | 2255 | 5511 |
| 10 | 2362 | 4960 |
| 11 | 2480 | 4509 |
| 12 | 2611 | 4133 |
| 13 | 2756 | 3815 |
| 14 | 2918 | 3543 |
| 15 | 3100 | 3307 |
| 16 | 3307 | 3100 |
| 17 | 3543 | 2918 |
| 18 | 3815 | 2756 |
| 19 | 4133 | 2611 |
| 20 | 4509 | 2480 |
| 21 | 4960 | 2362 |
| 22 | 5511 | 2255 |
| 23 | 6200 | 2157 |
| 24 | 7086 | 2067 |
| 25 | 8267 | 1984 |
| 26 | 9920 | 1908 |
| 27 | 12400 | 1837 |
| 28 | 16533 | 1771 |
| 29 | 24800 | 1710 |
| 30 | 49600 | 1653 |
| 31 |  | 1600 |

FIG 6B

| Rref: | 50 |
|---|---|
| i | Ri |
| 1 | 3,125 |
| 2 | 2,936 |
| 3 | 2,763 |
| 4 | 2,605 |
| 5 | 2,460 |
| 6 | 2,327 |
| 7 | 2,205 |
| 8 | 2,092 |
| 9 | 1,987 |
| 10 | 1,890 |
| 11 | 1,800 |
| 12 | 1,717 |
| 13 | 1,638 |
| 14 | 1,566 |
| 15 | 1,498 |
| 16 | 1,434 |
| 17 | 1,374 |
| 18 | 1,318 |
| 19 | 1,265 |
| 20 | 1,216 |
| 21 | 1,169 |
| 22 | 1,125 |
| 23 | 1,083 |
| 24 | 1,044 |
| 25 | 1,006 |
| 26 | 0,971 |
| 27 | 0,938 |
| 28 | 0,906 |
| 29 | 0,876 |
| 30 | 0,847 |
| 31 | 0,820 |

ANALOG-TO-DIGITAL CONVERTER

CROSS REFERENCE TO RELATED APPLICATION

This Utility Patent Application claims the benefit of the filing date of German Application No. DE 102 55 915.5, filed Nov. 29, 2002, and International Application No. PCT/DE03/003606, filed Oct. 29, 2003, both of which are herein incorporated by reference.

BACKGROUND

The invention relates to an analog-to-digital converter.

An analog-to-digital converter (ADC) is an electronic circuit or an electronic chip which converts an analog signal into a digital equivalent. An ADC converts a continuous-value voltage value into a binary number which indicates how often a particular voltage range is included within the voltage value.

Analog-to-digital converters (ADCs) are used at interfaces between analog signals and digital data processing. Fundamental service features of an ADC are the achievable resolution of the converter (measured in bits) and the conversion speed (measured in samples per second: Sa/s). Particularly in the field of communications engineering, there is a need for very fast converters, that is, converters with high conversion rates (for example, >1 GSa/s). The resolution of known converters is normally between 5 bits and 8 bits, and the circuit architecture is based on a flash converter architecture.

Figure 1:
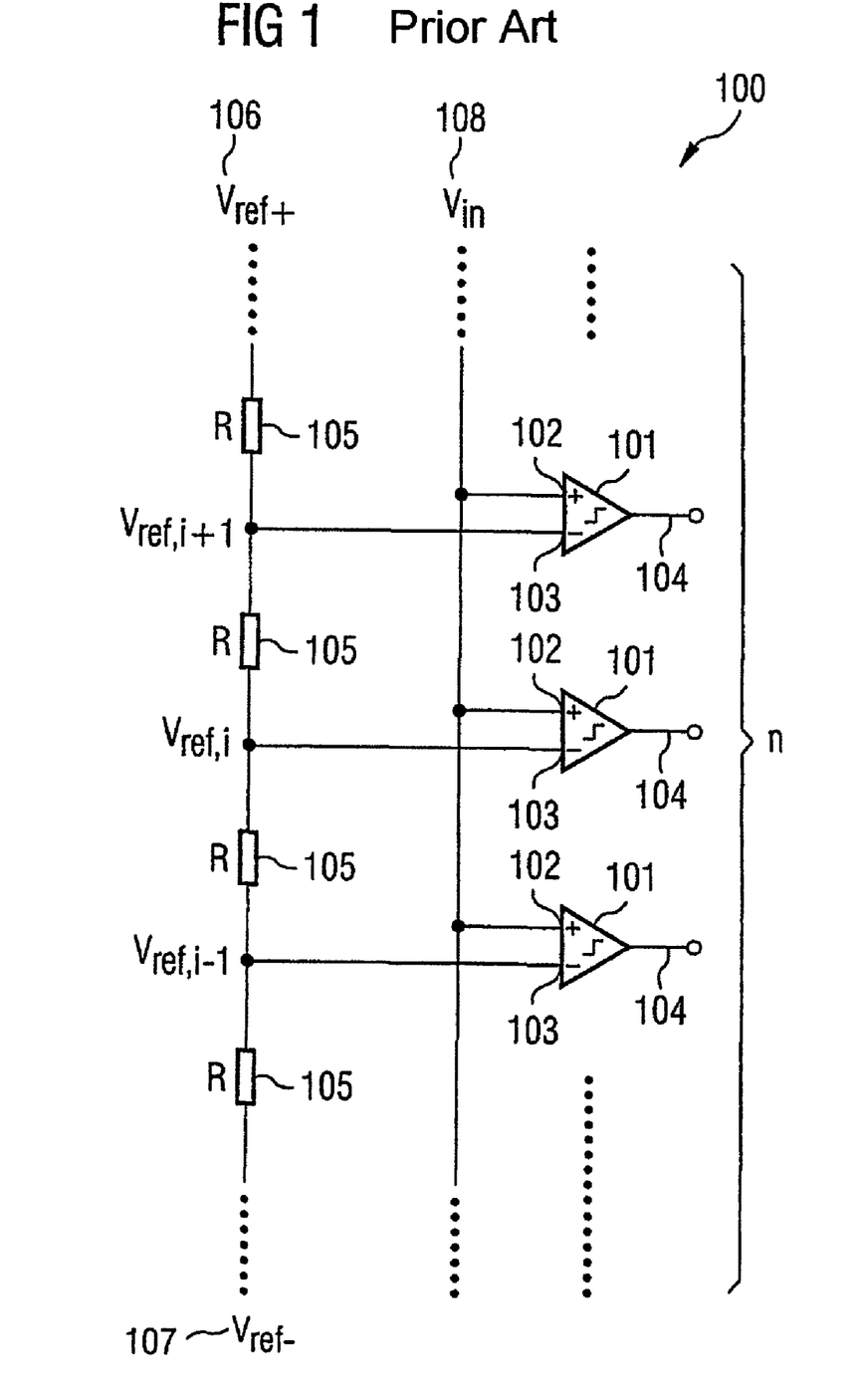
FIG. 1 illustrates an analog-to-digital converter based on the prior art.

FIG. 1 illustrates an analog-to-digital converter 100 which is known from the prior art.

The analog-to-digital converter 100 has a multiplicity of comparators 101 that each have a first input 102, a second input 103 and an output 104. Provided at the first input 102 of each comparator is a signal 108 $V_{in}$ for digitization in the form of an electrical voltage signal. Connected between a respective second input 103 on a comparator 101 and a positive reference potential 106 $V_{ref+}$ or a negative reference potential $V_{ref-}$ are a number of nonreactive resistors 105 which are characteristic of each of the comparators. By way of example, a single resistor 105 is connected between the second input 103 of the top comparator 101 in FIG. 1 and the positive reference potential 106, two nonreactive resistors 105 are connected between the second input 103 of the second-from-top comparator 101 in FIG. 1 and the positive reference potential 106 $V_{ref+}$, etc. The voltage drop across the nonreactive resistors 105 connected between the reference potential 106, 107 and the second input 103 of a respective comparator 101 is used to reduce the potential applied to the second input 103 in FIG. 1 from the top to the bottom in stages, so that a comparative result at the outputs of the comparators 101 supplies a sequence of output values with the logic value "1" and then a sequence of output values with the logic value "0". This digitized output signal is called a thermometer code, where the number of comparator outputs 104 providing a logic value "1" represents a digitized measure of the value of the signal 108 for digitization.

In the case of the circuit illustrated in FIG. 1 for an analog-to-digital converter 100 based on the prior art, the n comparators 101 compare the input voltage $V_{in}$ 108 with reference voltages $V_{ref,i}$ which are generated using the resistor network comprising resistors 105. The resistor network is normally in the form of a linear voltage divider which is used to apply a reference voltage $V_{ref+}$ or $V_{ref-}$. By using the same resistors 105, the reference voltage $V_{ref}=V_{ref+}-V_{ref-}$ is distributed evenly over the comparators.

Known circuit designs for analog-to-digital converters are based on the "flash" process. In this context, the input voltage $V_{in}$ 108 for digitization is simultaneously applied to the first inputs 102 of the comparators 101. To achieve a resolution of n bits, $2^n-1$ comparators 101 are required. The second input 103 of the comparators 101 has respective different subvoltages applied to it that are produced using an integrated reference resistor network comprising the resistors 105. The accuracy or the resolution of the analog-to-digital converter 100 is determined essentially by the accuracy of the reference resistor network and by the offset in the comparators 101. These factors are determined by statistical variations in component parameters, which decrease as the surface area of the components increases.

The conversion speed of an A/D converter 100 is determined primarily by the architecture and by the speed of the comparators 101. Often, a sample-and-hold circuit is connected upstream of the actual converter block, said sample-and-hold circuit storing and holding the input voltage at a particular time in analog form and making it available to the converter block. This also limits the conversion speed and/or the resolution of the converter.

The analog-to-digital converter based on the prior art has a conversion speed which is in need of improvement.

Depending on the model, a comparator has a defined voltage window within which it works in optimum fashion, that is, it provides the comparison result for its two analog input voltages in a sufficiently short time and with sufficient accuracy at the output 104 in digital form. The signal propagation time in a comparator 101 is always dependent on the input voltage for the comparator 101, however. There is an optimum input voltage at which the comparison result is available in comparatively short time. If the input voltage approaches the limits of the voltage window, the propagation time in a comparator increases and the conversion speed is reduced.

In the case of the analog-to-digital converter 100 based on the prior art, each of the comparators 101 operates at a different input voltage. The comparators 101 therefore need to be designed for a wide input voltage range.

Hence, in the case of the described flash architecture based on the prior art, the principle means that a different input voltage is applied to each comparator, which means that each comparator has a different signal propagation time.

To process differential signals in an analog-to-digital converter, the prior art involves the two mutually antiphase input signals for respective independent comparators being converted into a digital signal and then digitally subtracted. In rare cases, complex comparators having four inputs are even used.

U.S. Pat. No. 6,114,982 discloses an analog-to-digital converter having a first resistor ladder between a first reference voltage and a second reference voltage and also having a second resistor ladder whose two end sections are coupled to an analog signal source.

GB 2,187,054 A discloses an analog-to-digital converter having a plurality of amplifiers whose inputs are supplied with an analog signal via a resistor chain.

JP-07254857 A discloses an analog-to-digital converter in which the influence of an offset needs to be reduced and A/D conversion needs to take place sufficiently quickly and accurately.

U.S. Pat. No. 6,437,724 B1 discloses an analog-to-digital converter having two networks of resistor elements to which analog signals are applied and which are coupled to inputs on comparators.

EP 0 729 233 A1 discloses an analog-to-digital converter which can be used to compensate for a comparator offset.

SUMMARY

One embodiment of the invention specifies an analog-to-digital converter which has an increased conversion speed over the prior art.

According to one embodiment, the analog-to-digital converter for converting a signal to be digitized into a digitized signal has a plurality of comparators, each of which has a first and a second input and an output, which output can be used to provide the digitized signal. In addition, the analog-to-digital converter contains an impedance network for each comparator, which is coupled to at least one input of the comparator, where a respective impedance network is connected between the associated comparator and the signal to be digitized and is connected between the associated comparator and a first electrical reference potential. The impedance networks are set up such that the comparators are brought essentially to the same operating point close to their specific decision threshold.

"Close to the specific decision threshold" may mean, in particular, that the operating state of a comparator is chosen or can be set within a prescribed tolerance range around the decision threshold.

One embodiment of the invention uses a resistor network at the input to shift the input voltages for the comparators in the analog-to-digital converter to almost the same voltage value, that is, to operate the comparators at the same operating point. This significantly reduces the problems that arise in the prior art with greatly differing signal propagation times in the comparators in an analog-to-digital converter.

In one embodiment, the analog-to-digital converter uses a resistor network at the converter input to shift the input voltages for the comparators such that all comparators can be operated at approximately the same operating point. The comparator can thus be optimized to this operating point, which means that the analog-to-digital converter has an increased conversion speed. The synchronization of the comparator results which is achieved in this manner means that it is additionally possible to dispense with a sample-and-hold circuit as is frequently required in the prior art, which additionally improves the performance of the analog-to-digital converter or reduces the manufacturing complexity.

In one embodiment, the resistor network connected between the signal for digitization and the comparators at the input of the converter replaces the resistor network between the reference voltage and the comparators which is required for producing reference voltages in the case of known flash converters. In this way, it is possible to resort to a greatly simplified comparator architecture, which additionally improves the conversion speed of the converter and simplifies the circuit design in modern CMOS processes at low operating voltages. The approximately identical input voltages for the comparators mean that calibration techniques ("autozeroing" techniques) are also easy to implement for the purpose of reducing offsets in the comparators that result from manufacture, for example.

In addition, in one embodiment the circuit architecture for the analog-to-digital converter permits genuine rail-to-rail operation of the analog-to-digital converter. That is to say that the analog input voltage for the converter may be between an upper operating voltage limit and a lower operating voltage limit. If the impedance network is provided with suitable dimensions, the input voltage may even exceed/undershoot the operating voltage limits.

CMOS analog-to-digital converters known from the prior art often have a nonreactive input resistance bordering on infinity, which means that a purely capacitive input impedance is provided. In contrast to this, the input of the analog-to-digital converter according to one embodiment of the invention has an input impedance with a resistive component on account of the use of a resistor network at the input. Particularly in the case of converters with high conversion rates and therefore usually high input frequencies, the resistive component of the input impedance may even be an advantage. At high input frequencies, a terminating resistor for an input line in the form of a waveguide is normally necessary anyway in order to avoid signal reflections. The capacitive load would need to be operated by the source anyway, and the capacitive load has the same order of magnitude as the resistive load at high input frequencies. With the analog-to-digital converter architecture, the terminating resistor is already present in the form of the input resistance of the analog-to-digital converter.

The second input of at least some of the comparators, and in one case of all comparators, in the analog-to-digital converter according to one embodiment may be brought to a second electrical reference potential. The second electrical reference potential may be the ground potential, for example.

At least some of the impedance networks for the comparators in the analog-to-digital converter may have a first nonreactive resistor and a second nonreactive resistor, the first nonreactive resistor being connected between the first input of at least some of the comparators and the first electrical reference potential. The second nonreactive resistor may be connected between the first input of at least some of the comparators and the signal to be digitized.

At least some of the impedance networks may have a voltage divider. The voltage divider may have a first impedance or may be formed thereby, said first impedance being connected between the first input and a third electrical reference potential. In addition, the voltage divider may have a second impedance or may be formed thereby, said second impedance being connected between the first input and the first electrical reference potential. The first impedance may be a third nonreactive resistor and/or the second impedance may be a fourth nonreactive resistor. Each of the nonreactive resistors may be produced, by way of example, using one or more nonreactive single resistors. Alternatively, the first impedance may be a first capacitance and/or the second impedance may be a second capacitance. In other words, the voltage divider may either have a capacitive and/or a resistive component. Each of the capacitances may be produced using one or more capacitors, for example.

The third electrical reference potential may be the electrical ground potential. Hence, the potential across the first impedance in the voltage converter may be identical to the electrical potential at the second inputs of the comparators, which means that the number of reference potentials required is kept down.

The first electrical reference potential may be split into a first potential part and into a second potential part, with a first portion of the comparators having their impedance network connected between the first input and the first potential part, and with a second portion, or the remaining portion, of the comparators having their impedance network connected between the first input and the second potential part. By way of example, the first half of comparators in the analog-to-digital converter may be connected to a positive reference potential as the first potential part, whereas the second portion of the comparators (for example, the second half of the comparators) may be connected to a negative second potential part. With an uneven number of n comparators, (n−1)/2 comparators may be connected to the positive reference potential, (n−1)/2 other comparators may be connected to the negative reference potential, and a comparator may be connected to the positive or to the negative or to another reference potential.

In one embodiment, the second and/or the third electrical reference potential have a value between the first and the second potential part, their potential in one case being the arithmetic mean from the first and second potential parts. The second and/or the third electrical reference potential may thus be the electrical ground potential, the first potential part may be a potential which is increased by a prescribed value over the ground potential, and the second potential part may be a potential which is reduced by this value.

At least some of the comparators may have a calibration device provided for them which is set up such that it can be used to correct a parameter fluctuation between different comparators.

As a result of manufacture, the comparators in the analog-to-digital converter may have a different offset value, which fluctuation may impair the functionality of the analog-to-digital converter. The calibration device may be used to compensate for this fluctuation, which means that a smooth functionality in the analog-to-digital converter is made possible.

By way of example, the calibration device may have a switching element (which may be provided in the form of a transistor switch, for example) between the first input of a comparator and the impedance network, which switching element can be used to couple the first input of the comparator to the impedance network in a detection mode. Alternatively, the first input may be brought to a fourth electrical reference potential in a calibration mode, a resultant signal at the output of the comparator in this operating state being taken as a basis for calibrating the comparator using the calibration device.

The fourth electrical reference potential may be the same as the second electrical reference potential and may, in particular, be the same as the ground potential. The first input and the second input may be brought to the same electrical potential in the calibration mode and the resultant output signal may be taken as a basis for eliminating or reducing a possible offset in the associated comparator.

The value of at least one of the first to fourth nonreactive resistors may be calculated, in at least some of the impedance networks, on the basis of the criterion that one of the first inputs of the comparators has a signal applied to it which is essentially the same as the second electrical reference potential. This specific comparator represents that location in the arrangement of comparators at which the outputs of the comparators change from a logic value "1" to a logic value "0" (or vice versa).

The value of the first to fourth nonreactive resistors may additionally or alternatively be calculated, at least for some of the impedance networks, on the basis of the criterion that altering the signal to be digitized by a prescribable value results, for at least some of the comparators, in an alteration to the electrical potential at their first input by an essentially equal value.

The values of the resistors are in one case chosen such that the sensitivity of the comparator voltage to the input voltage is essentially the same for all comparators.

In addition, the value of at least one of the first to fourth nonreactive resistors may be calculated, for at least some of the impedance networks, on the basis of the criterion that the nonreactive output resistance of at least some of the impedance networks is essentially the same.

In line with one exemplary embodiment, all three of the criteria described above may be taken as a basis for calculating optimized values of the nonreactive resistors in the impedance networks of the analog-to-digital converter.

In addition, in one embodiment of the analog-to-digital converter, at least some of the comparators have the impedance network containing a first impedance device part coupled to the first input and an impedance device part coupled to the second input. In addition, the signal to be digitized may be split into a first and into a second signal part to be digitized. The first electrical reference potential may be split into a first potential part and into a second potential part. The impedance device part may be connected between the first input, the first signal part for digitization and the first potential part. The second impedance device part may be connected between the second input, the second signal part to be digitized and the second potential part.

The first and second signal parts for digitization may be differential signals.

In other words, one embodiment of the analog-to-digital converter may also match circuit architectures in which an input signal to be digitized is provided in duplicate, that is, in the form of two complementary signals. In such a case, the first input of the comparator receives one of the two differential signals to be digitized which have been modified by means of the impedance network, and the second input receives the other of the two differential signals to be digitized, again modified by means of the impedance network.

In one embodiment of the analog-to-digital converter, the first impedance device part may have a first nonreactive resistor and a second nonreactive resistor, the first nonreactive resistor being connected between the first input and the first electrical potential part, the second nonreactive resistor being connected between the first input and the first signal part to be digitized. In addition, the second impedance device part may have a third nonreactive resistor and a fourth nonreactive resistor, the third nonreactive resistor being connected between the second input and the second electrical potential part, and the fourth nonreactive resistor being connected between the second input and the second signal part to be digitized. The two signal paths for the differential signals are designed such that they mirror one another.

At least one fifth nonreactive resistor may be connected between the first and second inputs. The fifth nonreactive resistor may be a single resistor, for example, or may be split into two resistor parts.

The fifth nonreactive resistor may be split into a first and into a second resistor part, with a connection between the first and second resistor parts being able to be brought to a fifth electrical reference potential, or to the electrical ground potential. In line with this refinement, a center tap is provided between the two resistor parts and may be brought to a defined electrical potential.

The analog-to-digital converter according to one embodiment of the invention may be set up as an integrated circuit, and in particular may be integrated on and/or in a substrate, or a semiconductor substrate (for example, using silicon technology).

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The text below describes an analog-to-digital converter 200 based on one exemplary embodiment of the invention with reference to FIG. 2.

The analog-to-digital converter 200 contains a multiplicity of comparators 201, each of which has a first input 202, a second input 203 and an output 204. The output 204 of each of the comparators 201 provides 1 bit of a thermometer code which represents the digitized signal. Put another way, each output 204 of each comparator 201 provides a signal having a first logic value (for example, logic value "1") or having a second logic value (for example, logic value "0"), on the basis of which electrical potentials are applied to the inputs 202, 203 of the respective comparator 201. In addition, each comparator 201 is provided with a resistor network 212 comprising first to third nonreactive resistors 209 to 211, which is coupled to the first input 202 of each comparator 201. The resistor network 212 associated with the respective comparator 201 is connected between the associated comparator 201 and a signal $V_{in}$ 207 to be digitized. In addition, the resistor network 212 is connected between an associated comparator 201 and an associated electrical reference potential $V_{ref+}$ 205 or $V_{ref-}$ 206.

The analog-to-digital converter 200 has n comparators 201. The upper portion of comparators 201 in FIG. 2 has a positive reference potential $V_{ref+}$ as electrical reference potential, whereas the lower portion of the comparators 201 in FIG. 2 has a negative reference potential 206 $V_{ref-}$ as electrical reference potential. The second input 203 of the comparators 201 has respectively been brought to the electrical ground potential 208. The first nonreactive resistor 209 $R_{ref,i}$ is connected between the respective reference potential 205 or 206, on the one hand, and the first input 202 of the associated comparator 201. The second nonreactive resistor $R_{in,i}$ of a respective comparator 201 is connected between the first input 202 of the associated comparator 201 and the signal $V_{in}$ 207 to be digitized. In addition, a third nonreactive resistor $R_{gnd,i}$ 211 is connected between the first input 202 of the associated comparator 201 and the electrical ground potential 208.

The analog-to-digital converter 200 contains n comparators, where n is in one case an uneven number. As FIG. 2 illustrates, the electrical potential $V^{ref+}$ is applied to those first nonreactive resistors 209 which are associated with the upper (n−1)/2 comparators 201 in FIG. 2. The electrical potential $V_{ref-}$ is applied to those first nonreactive resistors 209 which are associated with the lower (n−1)/2 comparators 201 in FIG. 2. That comparator 201 which is arranged between the (n−1)/2 upper and the (n−1)/2 lower comparators 201, namely the comparator 201 with the index "0", is not provided with a first nonreactive resistor 209. Put in clear terms, a nonreactive resistor 209 could also be provided for the comparator 201 with the index "0"; this comparator would then have a nonreactive resistor value approaching infinity.

It should be noted that the values of the first nonreactive resistor $R_{ref,i}$ 209 may be different for different comparators 201. Similarly, the values of the second and third nonreactive resistors $R_{in,i}$ 210, $R_{gnd,i}$ 211 from different comparators 201 may have different values.

The text below describes the functionality of the analog-to-digital converter 200.

The input voltage $V_{in}$ 207 is shifted by means of a resistor network 212 connected upstream of each comparator 201 such that an input voltage close to the electrical ground potential 208 is applied close to the specific decision threshold of the respective comparator 201. Hence, all comparators 201 operate at similar operating points and may thus be optimized to the maximum performance. The nonreactive resistors 209 to 211 have the function of shifting the input signal $V_{in}$ 207 using the reference voltage $V_{ref}$ (which is subsequently used as generic term for the positive reference potential 205 $V_{ref+}$ and for the negative reference potential 206 $V_{ref-}$) to an extent which is such that at a prescribed input voltage $V_{in,i}$ 207 a potential close to the electrical ground potential 208 is applied to a first input 202 on a respective comparator 201. The third nonreactive resistor $R_{gnd}$ 211 is used to adapt the sensitivity of a respective comparator 201 for the input voltage $V_{in,i}$ 207.

The following applies for the input node $V_{comp}$ 213 of the i-th comparator 201:

$$\frac{V_{in} - V_{comp,i}}{R_{in,i}} - \frac{V_{comp,i}}{R_{gnd,i}} + \frac{V_{ref,\pm} - V_{comp,i}}{R_{ref,i}} = 0 \quad (1)$$

To shift the input voltage $V_{in}$ 207 to ground level 208, a reference voltage $V_{ref,\pm}$ 205, 206 is used. This reference voltage is positive ($V_{ref+}$) when a negative input voltage $V_{in}$ 207 is intended to be processed, and is negative ($V_{ref-}$) when a positive input voltage $V_{in}$ 207 is intended to be processed.

In line with the exemplary embodiment described, the first secondary condition for calculating the values of the first to third resistors 209 to 211 is that $V_{comp,i}=0$ for $V_{in,i}=i\cdot_\Delta V$ with $i=-m,\ldots,0,\ldots,+m$, where $2m+1=n$. This means that the input voltage $V_{comp,i}$ on the i-th comparator 201 needs to be exactly zero when the input voltage 207 has a particular value $V_{in,i}=i\cdot_\Delta V$.

This is expressed by equation (2):

$$\frac{i\cdot \Delta V}{R_{in,i}} + \frac{V_{ref,\pm}}{R_{ref,i}} = 0 \quad (2)$$

In equation (2) $_\Delta V$ denotes a (sufficiently small) voltage difference which corresponds to the least significant bit (LSB) in the analog-to-digital converter 200 and thus determines the resolution.

The second secondary condition demanded for calculating the values of the nonreactive resistors 209 to 211 is that the sensitivity of the comparator voltage to the input voltage be the same for all comparators 201. When the input voltage changes by $_\Delta V_{in}$, for example, the input voltage on each comparator 201 close to its decision threshold $V_{comp,i}=0$ needs to change by a value $_\Delta V_{comp}$:

$$\frac{\partial V_{comp,i}}{\partial V_{in}} = \frac{1}{1 + \frac{R_{in,i}}{R_{ref,i}} + \frac{R_{in,i}}{R_{gnd,i}}} = const. \; \forall \; i \quad (3)$$

To keep the influence of parameter fluctuations at a low level, this value needs to be as large as possible. Within the n comparators 201 in the analog-to-digital converter 200, the two comparators 201 with $i=-m$ and $i=+m$ have the least sensitivity.

In addition, signal dynamics considerations allow a third secondary condition to be formulated for calculating the values of the nonreactive resistors 209 to 211. Since each comparator input has an input capacitance, a low-pass filter is formed in combination with the upstream resistor network 212. So that the input signal undergoes essentially the same frequency shaping on each comparator 201, the output resistance $R_{out}$ of the resistor network 212 should be identical for all comparators 201:

$$\frac{1}{R_{in,i}} + \frac{1}{R_{ref,i}} + \frac{1}{R_{gnd,i}} = \frac{1}{R_{out}} = const. \; \forall \; i \quad (4)$$

Calculating the resistor values 209 to 211 is simple when the positive reference voltage $V_{ref+}$ 205 or the negative reference voltage $V_{ref-}$ corresponds to the limit values of the input voltage $V_{in}$ 207, that is, $V_{ref+}=m\cdot_\Delta V$ or $V_{ref-}=-m\cdot_\Delta V$.

In this case, it follows directly from equation (2) that $R_{in,m}=R_{ref,m}$. In addition, it follows from (3):

$$\frac{\partial V_{comp,m}}{\partial V_{in}} = \frac{1}{1 + \frac{R_{in,m}}{R_{ref,m}} + \frac{R_{in,m}}{R_{gnd,m}}} = \frac{1}{2} \; \text{for } R_{gnd,m} \to \infty \quad (5)$$

This also means that the following applies for all comparators 201:

$$\frac{1}{R_{in,i}} = \frac{1}{R_{ref,i}} + \frac{1}{R_{gnd,i}} \quad (6)$$

Using (4), it thus follows:

$$R_{in,i}=2R_{out}=R_{in}=const. \; \forall i \quad (7)$$

The second resistor $R_{in}$ 210 in all resistor networks 212 has the same value in this case.

To calculate all resistor values 209 to 211 unambiguously, it is expedient to determine the input resistance for the whole converter 200. This will be 50Ω, for example, which is a normal impedance in radio-frequency engineering. If a 6-bit analog-to-digital converter 200 is to be produced, at least 63 comparators need to be connected in parallel with their respective input resistor networks 212. To simplify calculation, it is subsequently assumed that 64 resistor networks 212 are connected in parallel. In this case, the input resistance of a single network is 3200Ω, and it follows from $R_{in,m}=R_{ref,m}$ that $R_{in}=R_{ref,m}=1600Ω$. The value of $R_{ref,i}$ can be calculated from equation (2), and the value $R_{gnd,i}$ can be calculated from equation (5).

Hence, all resistances 209 to 211 have been determined and the resistor network 212 will condition the input voltage for the analog-to-digital converter 200 for each comparator 201 such that all comparators 201 are always operated at an optimum operating point.

Figure 2A:
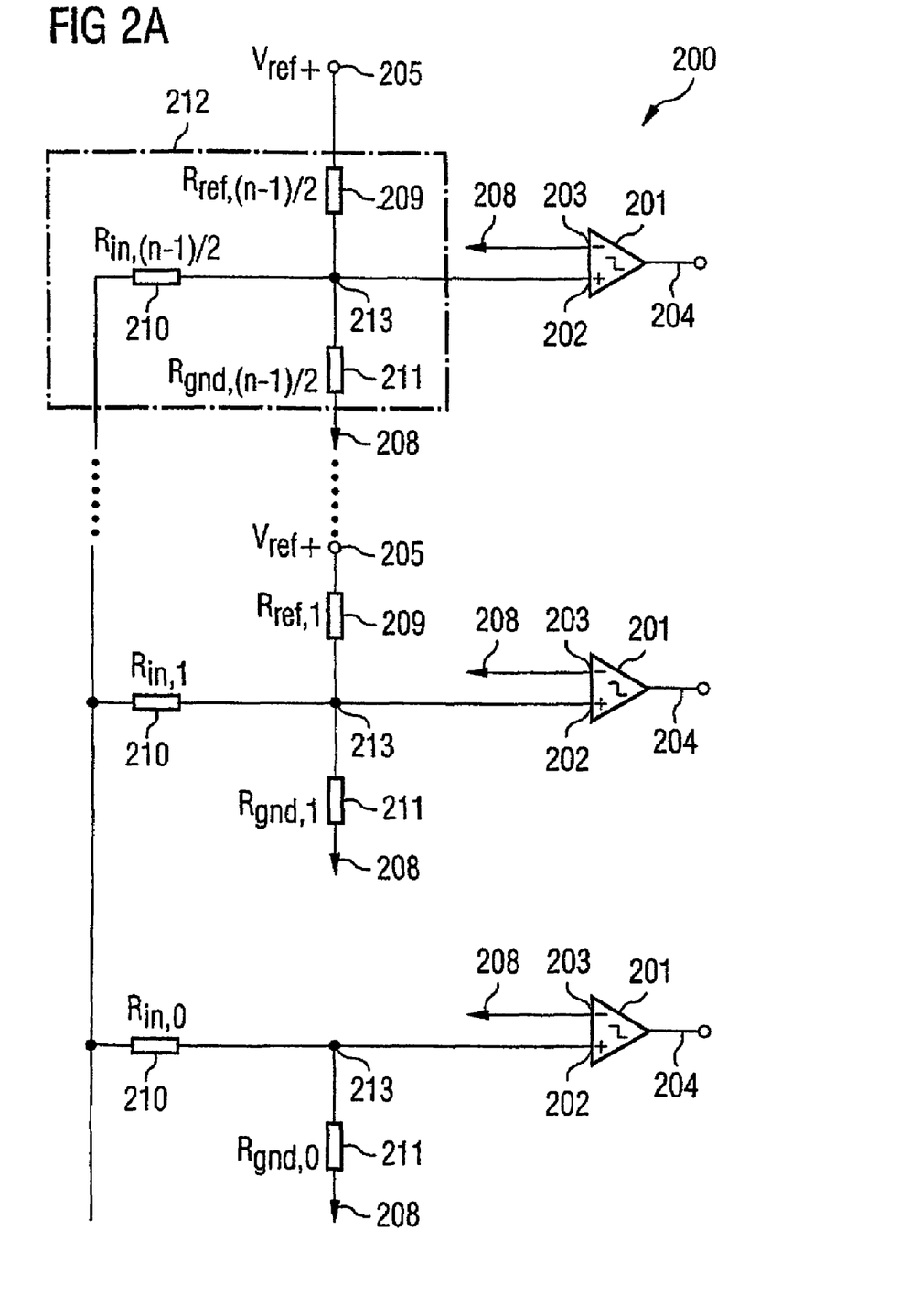
FIG. 2 illustrates an analog-to-digital converter according to one exemplary embodiment of the invention.
Figure 2B:
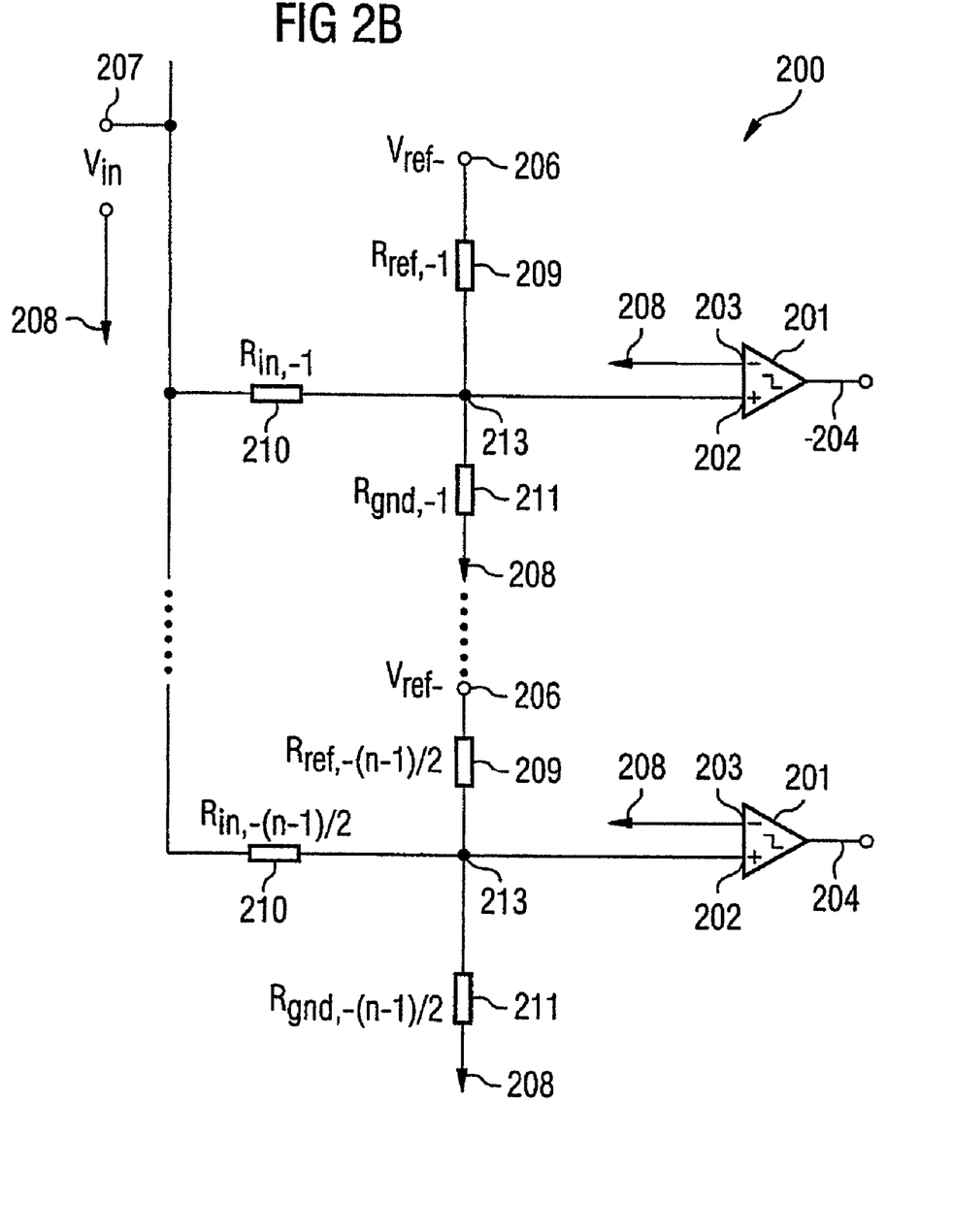
Figure 6A:
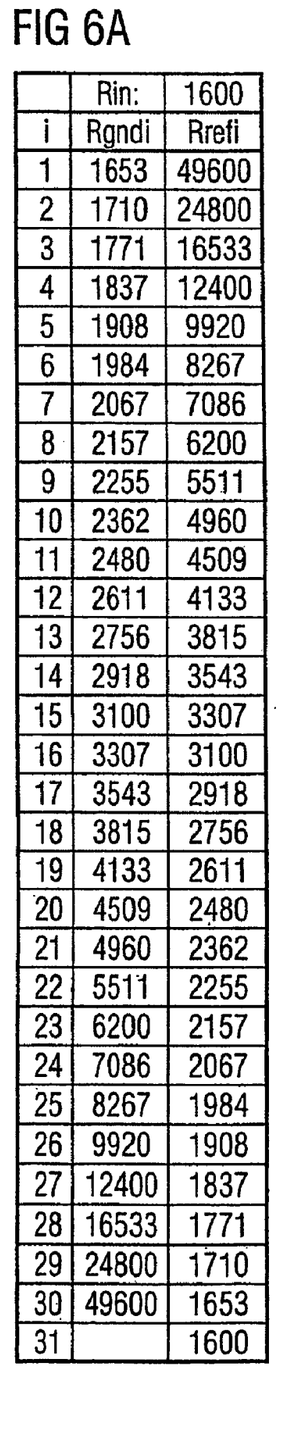
FIGS. 6A and 6B illustrate tables for resistor values for the analog-to-digital converter.

FIG. 6A illustrates the resistor values 209 to 211 for a 6-bit converter having an input impedance of 50Ω and for the exemplary embodiment illustrated in FIG. 2 (in Ω).

It should be noted that the third nonreactive resistors $R_{gnd,i}$ 211 are optional and may also be omitted in order to obtain an analog-to-digital converter which can be produced with even less complexity. When using the third nonreactive resistors $R_{gnd}$ 211, however, there is the assurance that the comparators 201 are operated at approximately the same sensitivity, which results in an increased effective resolution for the converter 200.

The text below makes reference to FIG. 3 to describe an analog-to-digital converter 300 based on an alternative exemplary embodiment of the invention.

The analog-to-digital converter 300 differs from the analog-to-digital converter 200 essentially by virtue of the modified interconnection of nonreactive resistors in the resistor networks. The analog-to-digital converter 300 has first nonreactive resistors 301, second nonreactive resistors 302 and third nonreactive resistors 303. The third nonreactive resistors 303 in FIG. 3 have essentially the same function as the third nonreactive resistors 211 in FIG. 2. By contrast, the functionality of the first and second nonreactive resistors 301, 302 in the analog-to-digital converter 300 is not identical to the functionality of the first and second resistors 209, 210 from FIG. 2.

Figure 3:
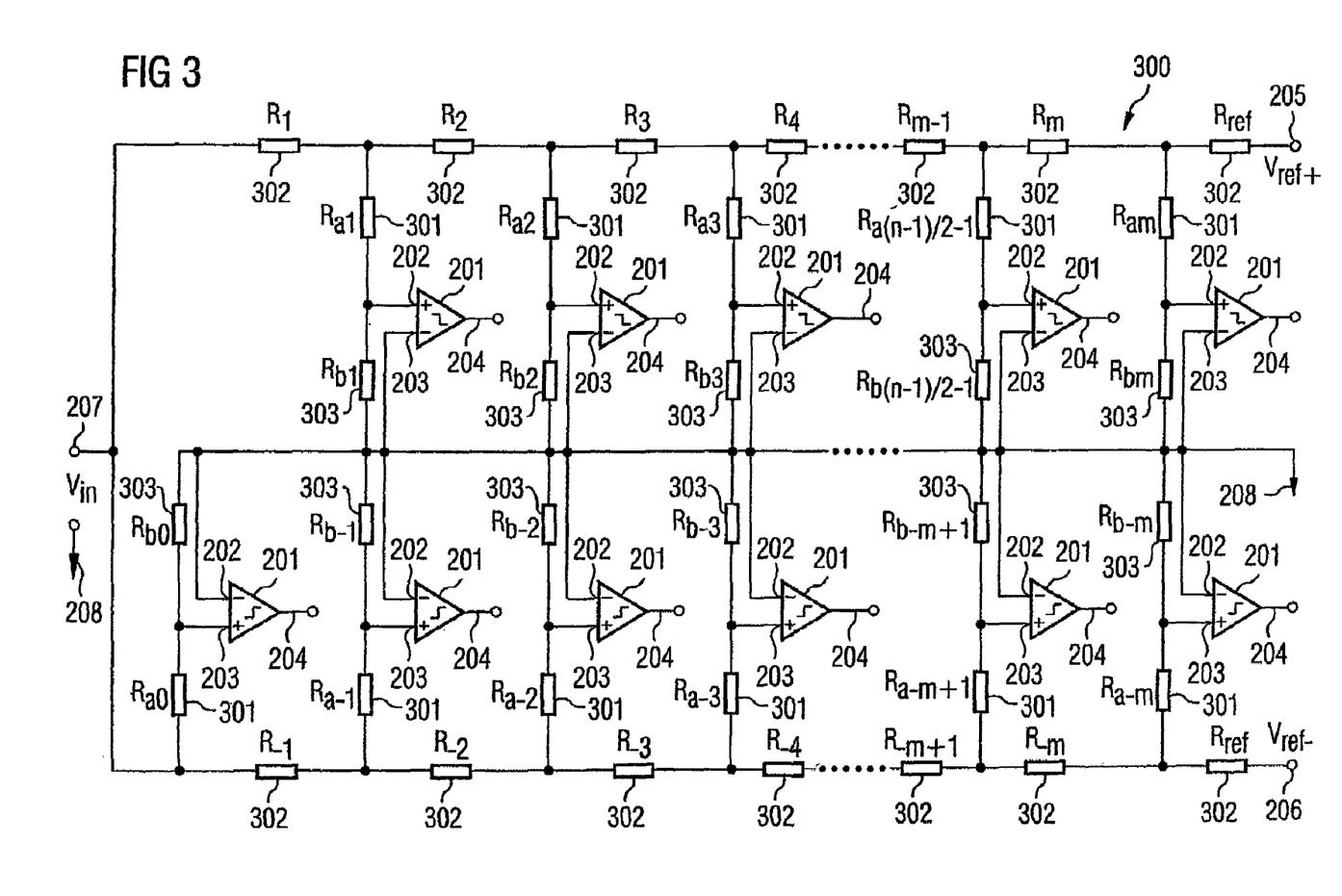
FIG. 3 illustrates an analog-to-digital converter according to one exemplary embodiment of the invention.

If one considers the top left-hand comparator 201 in FIG. 3, for example, its second input 203 is again grounded, that is, has been brought to the electrical ground potential 208. Connected between the first input 202 of the comparator 201 under consideration and the ground potential 208 is a third nonreactive resistor $R_{b1}$ 303. In addition, the first input 202 and the signal $V_{in}$ 207 to be digitized have a nonreactive total resistance connected between them which is made up of the first nonreactive resistor 301 $R_{a1}$ and the second nonreactive resistor $R_1$ 302. The resistors $R_{a1}$ and $R_1$ form an effective total resistance which is comparable to the resistor $R_{in,i}$ 210 from FIG. 2. In addition, the first input 202 of the comparator 201 and the positive reference potential $V_{ref+}$ 205 have a chain of resistors connected between them which is formed from the first resistor 301 $R_{a1}$ and a multiplicity of second resistors 302 ($R_2, R_3, \ldots, R_m, R_{ref}$). The functionality of the resistors $R_{a1}, R_2, R_3, \ldots, R_m, R_{ref}$ is comparable to the functionality of the first nonreactive resistor $R_{ref,i}$ 209 from FIG. 2.

In line with FIG. 3, the input voltage $V_{in}$ 207 is applied to a reference resistor network which generates input voltages for the comparators 201. The respective second input 203 of the comparators 201 is at the electrical ground potential 208. Each comparator 201 operates approximately at the same input voltage value and hence at almost the same operating point. In addition, the sensitivity of the comparators 201 is approximately identical as a result of a suitable choice of single resistors 301 to 303 for all comparators 201.

The input voltage $V_{in}$ 207 is divided or shifted using a series-path resistor chain comprising the second resistors $R_i$ 302. Using the first resistors $R_{a,i}$ 301 and the second resistors $R_{b,i}$ 302, it is possible to set the sensitivity of the individual comparators 201. The resistor values for the nonreactive resistors 301 to 303 cannot be calculated analytically in the case of the analog-to-digital converter 300. For this reason, the values of the nonreactive resistors 301 to 303 are ascertained by solving the following equation system numerically:

$$\frac{V_{i-1} - V_i}{R_i} + \frac{V_{i+1} - V_i}{R_{i+1}} - \frac{V_i}{R_{ai} + R_{bi}} = 0 \qquad (8)$$

and $$\frac{V_{comp,i}}{V_i} = \frac{R_{bi}}{R_{ai} + R_{bi}} \qquad (9)$$

with the secondary conditions:

$$V_{comp,i} = 0 \text{ for } V_{in,i} = i \cdot \Delta V \text{ with } i = -m, \ldots, 0, \ldots, m \quad (2m+1=n) \qquad (10)$$

and $$\frac{\partial V_{comp,i}}{\partial V_i} = const. \; \forall \, i \qquad (11)$$

On account of the many degrees of freedom for the numerical calculation, it is also possible to take into account further secondary conditions such as the output resistance of the network on the comparator connections.

The text below makes reference to FIG. 4 to describe an analog-to-digital converter 400 based on an alternative exemplary embodiment of the invention.

The analog-to-digital converter 400 differs from the analog-to-digital converter 300 illustrated in FIG. 3 essentially by virtue of the first and third nonreactive resistors 301, 303 having been omitted.

Consequently, the comparators 201 in the analog-to-digital converter 400 may have slightly different sensitivities. However, the resistor network from FIG. 4 is simplified over that in FIG. 3, and progressive analytical calculation of the values of the resistors 302 is possible.

For the voltage $V_{comp,i}$ at the nodes 401 which are coupled to the first input 202 of the comparators 201, the following applies generally:

$$\frac{V_{in} - V_{comp,i}}{\sum_{j=1}^{i} R_j} + \frac{V_{ref,\pm} - V_{comp,i}}{\sum_{j=i+1}^{m} R_j + R_{ref}} = 0 \qquad (12)$$

A secondary condition for calculating the resistor values 302 is $V_{comp,i}=0$ for $V_{in,i}=i \cdot \Delta V$ with $i=-m, \ldots, 0, \ldots, +m$, where $2m+1=n$. This means that the input voltage on the i-th comparator $V_{comp,i}$ needs to be exactly 0 when the input voltage has a particular value $V_{in,i}=i \cdot \Delta V$.

It thus follows from (12):

$$\frac{i \cdot \Delta V}{\sum_{j=1}^{i} R_j} + \frac{V_{ref,\pm}}{\sum_{j=i+1}^{m} R_j + R_{ref}} = 0 \qquad (13)$$

$\Delta V$ will be a small voltage difference which corresponds to the least significant bit (LSB) in the analog-to-digital converter 400. Simple calculation of the resistor values 302 is possible under the assumption that the reference potential $V_{ref}$ corresponds to the negative maximum input voltage for the analog-to-digital converter 400 ($V_{ref+}=m \cdot \Delta V$, $V_{ref-}=-m \cdot \Delta V$). In this case, it holds true that $$\sum_{j=1}^{m} R_j = R_{ref},$$

and it follows from (13):

$$\frac{i \cdot V_{ref,\pm}}{m \sum_{j=1}^{i} R_j} = \frac{V_{ref,\pm}}{2R_{ref} - \sum_{j=1}^{i} R_j} \qquad (14)$$

This can be simplified further to give:

$$R_i = \frac{2R_{ref}}{\frac{m}{i}+1} - \sum_{j=1}^{i-1} R_j \qquad (15)$$

In this case, the input resistance of the resistor network comprising the resistors 302 is obtained as $R_{in}=2R_{ref}/2=R_{ref}$. This value is obtained from the parallel connection of two networks (positive and negative paths) with a nonreactive resistor of $2R_{ref}$ in each case. If an input resistance of 50Ω is to be provided again, then $R_{ref}$ 50Ω needs to be chosen accordingly.

Using this choice of resistor value, formula (15) can be used to calculate the values of all further resistors progressively, starting at $R_1$.

Figure 4:
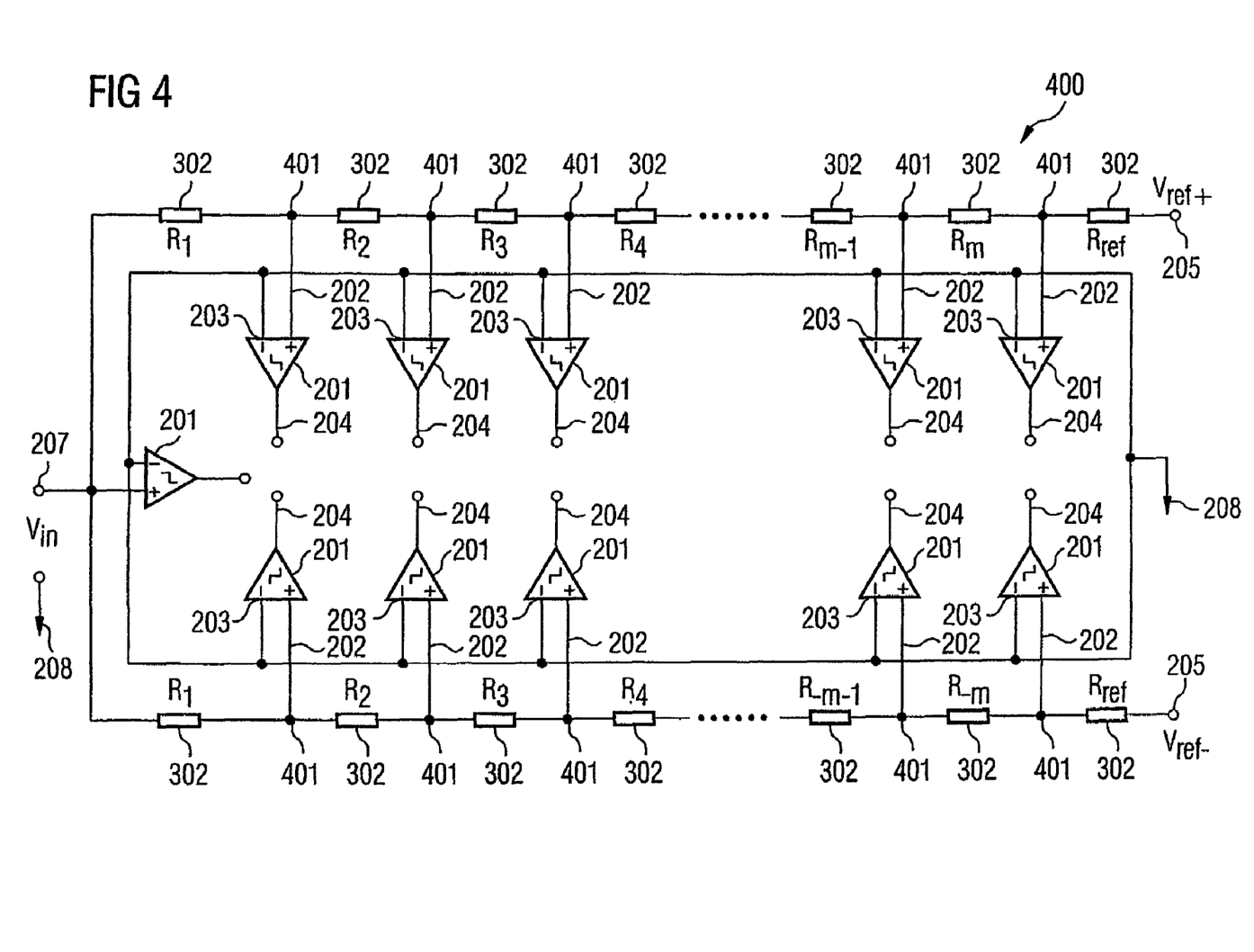
FIG. 4 illustrates an analog-to-digital converter according to one exemplary embodiment of the invention.
Figure 6B:
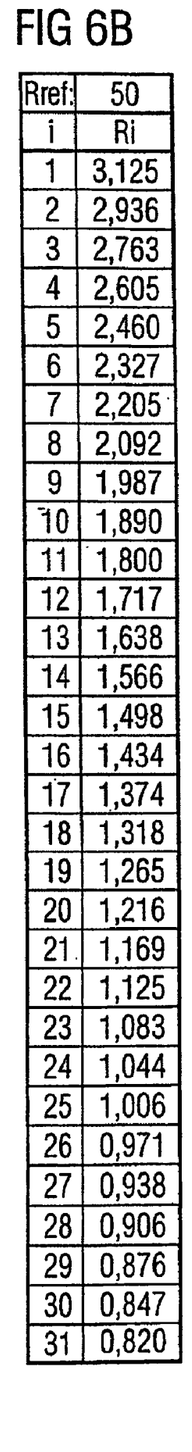

FIG. 6B illustrates the resistor values (in Ω) for a 6-bit converter based on the exemplary embodiment from FIG. 4.

If the value of the input resistance is chosen too high, dynamic distortions may arise during converter operation. In this case, the chain comprising resistors 302 and the input capacitances of the comparators 201 acts as a low-pass filter, which means that the comparators 201 with a high ordinal number, hence the m-th comparator, in particular, receive a slightly phase-shifted input signal. This is avoided in the case of the analog-to-digital converter 200 illustrated in FIG. 2.

The text below makes reference to FIG. 5 to describe an analog-to-digital converter 500 based on an alternative exemplary embodiment of the invention.

Figure 5:
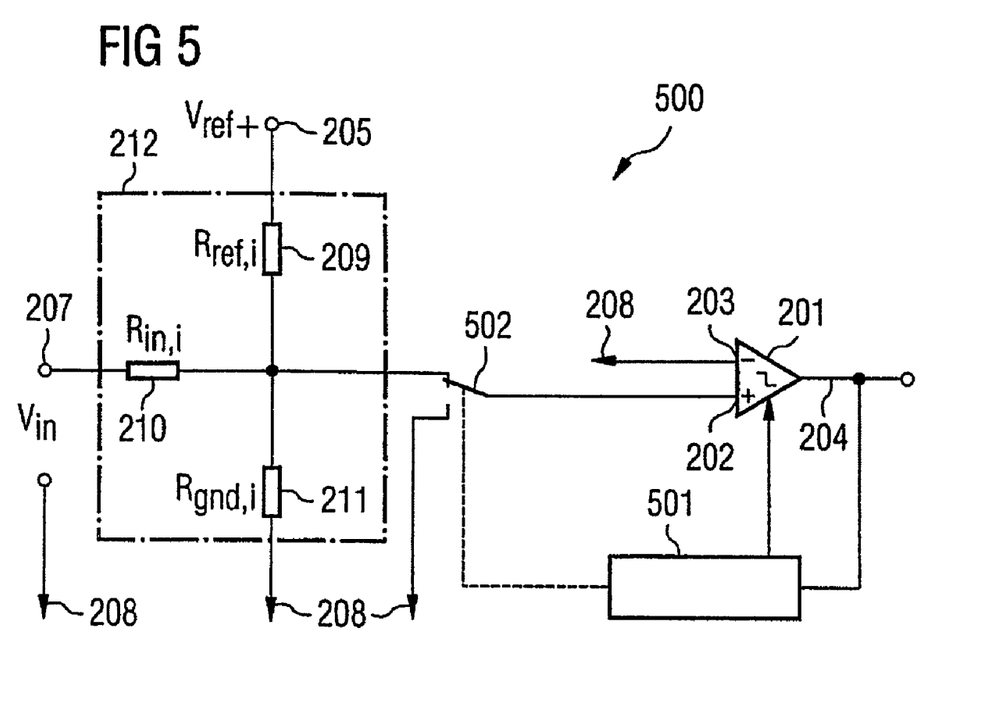
FIG. 5 illustrates an analog-to-digital converter according to one exemplary embodiment of the invention.

To be more precise, FIG. 5 illustrates the interconnection of a comparator 201 in an analog-to-digital converter using a calibration device 501. Hence, an analog-to-digital converter having a plurality of comparators can be formed from the interconnection of the comparator 201 from FIG. 5 in a similar manner to that illustrated in FIG. 2, FIG. 3, or FIG. 4.

The single stage of an analog-to-digital converter 500 which is illustrated in FIG. 5 differs from a single stage in the analog-to-digital converter 200 from FIG. 2 essentially by virtue of a calibration device 501 and a switch 502 being provided. The switch element 502 can be used to couple the first input 202 of the comparator 201 to the resistor network 212 in a measurement mode (see the switch position illustrated in FIG. 5 for the switch 502).

In the position of the switch 502 which is complementary to that in FIG. 5, the first input 202 has been brought to the electrical ground potential 208. In this position, the two inputs 202, 203 of the comparator 201 are at the electrical ground potential 208. On the basis of an output signal (ascertained in this scenario) from the comparator 201 at its output 204, the calibration device 501 for which this output signal has been provided readjusts the comparator 201 such that a possible offset in the comparator is equalized thereby.

Comparators 201 may have discrepancies in the position of their decision threshold on account of physical effects. In a comparator 201 which compares two voltages with one another, this is expressed in the form of an input voltage offset. These offset voltages are evenly distributed and are dependent on the characteristics of the semiconductor process for producing the comparators 201 and on the surface areas of all of the components used in the comparator 201. In this case, it holds true that the statistical discrepancy in the input voltage decreases as component surface area increases. When using very small-area components, this effect may result in the monotonicity of the digital signals no longer being assured. If the offset in a comparator 201 is greater than the voltage margin $_\Delta V$ of the switching threshold, a situation may arise in which at a particular input voltage a more significant comparator 201 is already indicating an output value with a logic value "1" and simultaneously a less significant comparator 201 is indicating an output value with a logic value "0" (or vice versa). The thermometer code provided at the output of the comparators 201 is therefore interrupted, which means that complex correction may be necessary in a downstream digital logic unit. In addition, an offset voltage in the comparators results in a reduction in the effective resolution of the converter. For these reasons, either the offset in the comparators needs to be chosen to be sufficiently low (which results in restrictive conditions for the component surface areas) and/or a calibration device like the calibration device 501 illustrated in FIG. 5 may be provided.

Since one embodiment the invention has the decision threshold of all comparators 201 at an input voltage close to the ground potential 208, the comparators 201 may be calibrated easily by applying the ground potential 201 to the first input 202. This is implemented in FIG. 5 by means of the switch 502 (semiconductor switch/transmission gate), which changes over the input 202 of the comparator 201 between the input voltage $V_{comp,i}$ and the ground voltage 208. In a defined input state, the calibration device 501 can adjust the comparator 201 such that it is exactly at the labile operating point. This adjustment is stored, and the comparator 201 can be operated in the measurement mode again. In contrast to conventional analog-to-digital converters, a multiplicity of additional calibration voltages are thus not necessary in order to calibrate the analog-to-digital converter 500, it merely being necessary to apply the ground potential 208, which is available anyway, to the first input 202 of the comparators 201.

It should be noted that a calibration circuit such as the one illustrated in FIG. 5 can be included in any other exemplary embodiment of an analog-to-digital converter based on one embodiment of the invention.

In the case of the calibration device in the analog-to-digital converter 500, very simple offset correction thus takes place in the comparators 201, since they are operating approximately at the same value of the input voltage. Each first comparator input 202 is applied to ground potential 208 by means of the switch 502, the comparison result at the output 204 is evaluated and the comparator 201 is trimmed using an adjustment input 503 which is accessed by the calibration device 501.

The text below makes reference to FIG. 7 and FIG. 8 to describe two additional exemplary embodiments of analog-to-digital converters which are set up to process a differential input signal.

Particularly in radio-frequency engineering, an input signal is frequently available in the form of a differential signal. Two mutually antiphase input signals $V_{in+}$ and $V_{in-}$ are frequently converted into a digital signal by respective independent comparators in an analog-to-digital converter based on the prior art and are then digitally subtracted.

Figure 7:
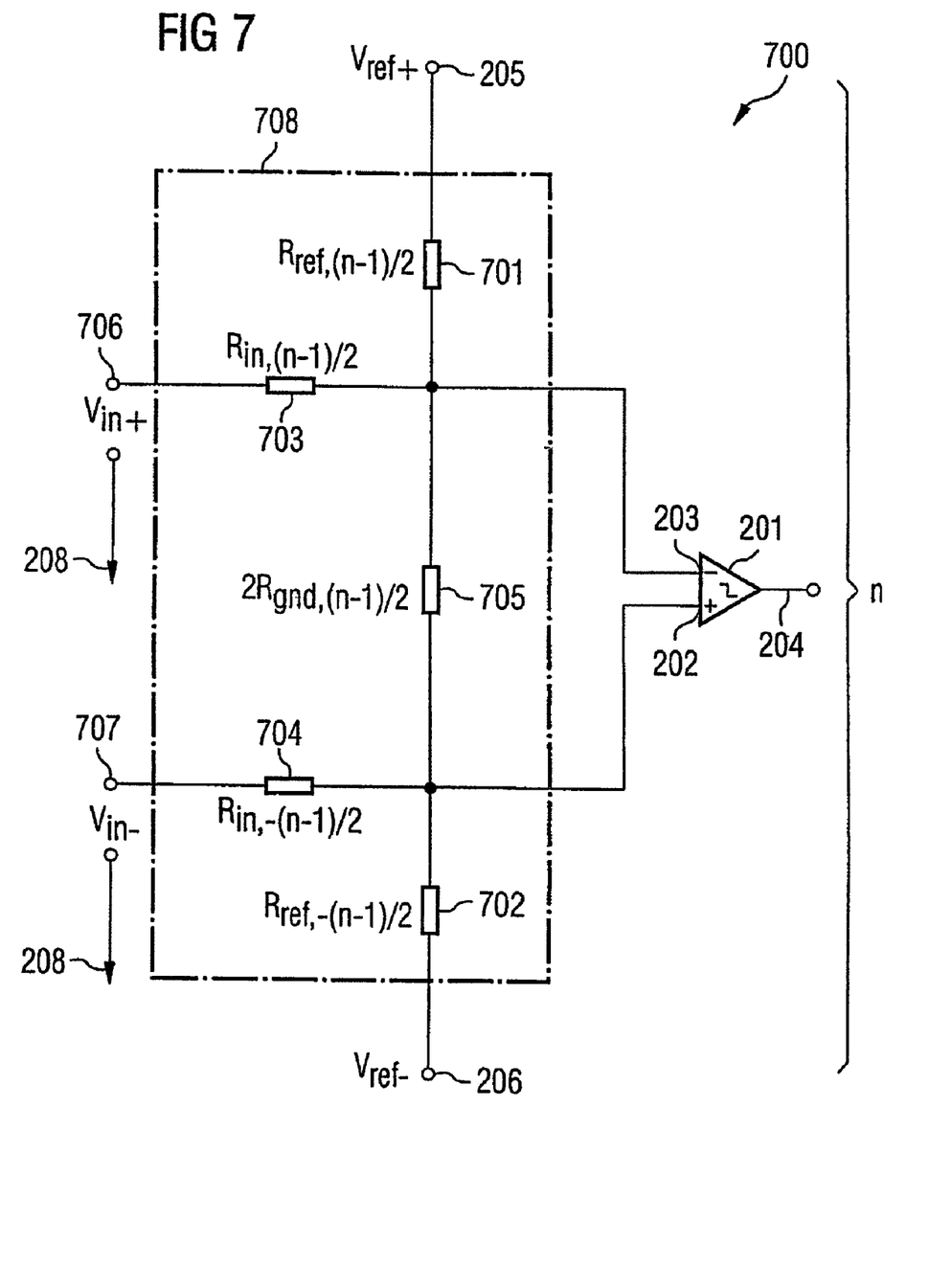
FIG. 7 illustrates an analog-to-digital converter according to one exemplary embodiment of the invention.
Figure 8:
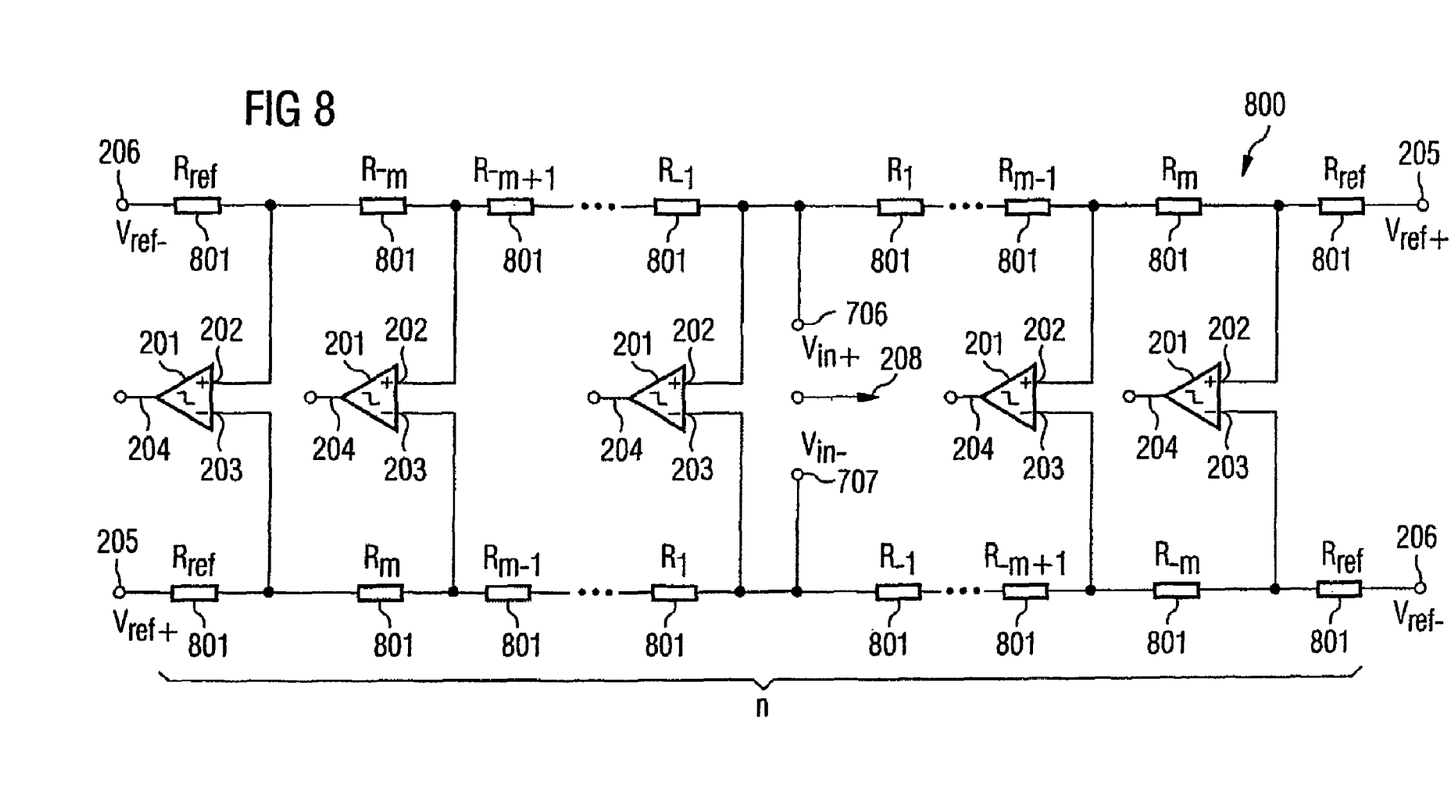
FIG. 8 illustrates an analog-to-digital converter according to one exemplary embodiment of the invention.

The analog-to-digital converters 700, 800 illustrated in FIG. 7 and FIG. 8 are well suited to the processing of differential signals. To this end, as a departure from the exemplary embodiments from FIG. 2 to FIG. 4, a shifted voltage signal $V_{comp,i+}$ from the positive path and the signal $V_{comp,i-}$ from the negative path are respectively applied to the two inputs of a respective comparator 201. If the input voltage passes the voltage value provided for this resistor network, then one input voltage for the comparator passes the ground potential in the positive direction and the other input voltage passes it in the negative direction. As a result of this architecture, the effective voltage swing on the comparator is twice as high as in the case of the nondifferential architecture. The doubled input amplitude on the comparator causes a reduction in the demands on the input voltage offset for the comparators accordingly. The differential signal processing may be implemented in any of the exemplary embodiments already presented.

The text below makes reference to FIG. 7 to describe an analog-to-digital converter 700 based on an alternative exemplary embodiment of the invention.

Again, FIG. 7 illustrates just one stage, that is, a comparator and an associated resistor network, of an analog-to-digital converter 700. The analog-to-digital converter 700 illustrated in FIG. 7 has a total of n such stages.

The analog-to-digital converter 700 from FIG. 7 again has a comparator 201 with a first input 202 and a second input 203, and also with an output 204. Connected between the second input 203 and the positive reference signal $V_{ref+}$ 205 is a first nonreactive resistor 701 $R_{ref,(n-1)/2}$. Connected between the first input 202 and the negative reference potential $V_{ref-}$ 206 is a second nonreactive resistor $R_{ref,-(n-1)/2}$. In addition, the second input 203 and a first signal part 706 $V_{in+}$ for digitization have a third nonreactive resistor $R_{in,(n-1)/2}$ connected between them. The second input 203 and a first signal part 706 for digitization have a third nonreactive resistor $R_{in,(n-1)/2}$ 703 connected between them. The first input 202 and a second signal part 707 for digitization have a fourth nonreactive resistor $R_{in,-(n-1)/2}$ 704 connected between them. In addition, the first and second inputs 202, 203 have a fifth nonreactive resistor $2R_{gnd,(n-1)/2}$ 705 connected between them. The fifth nonreactive resistor may also be split into two resistor parts whose center tap can be brought to a reference potential (for example, the electrical ground potential). The signal parts 706, 707 form a differential input signal which is processed jointly by the comparator 201. The stage in the analog-to-digital converter 700 which is illustrated in FIG. 7 represents the analog for the top stage illustrated in FIG. 2. Resistors 701 to 705 form a resistor network 708.

The differential input voltages $V_{in+}$ 706 and $V_{in-}$ 707 are shifted by means of two resistor dividers, which are connected upstream of each of the total of n comparators 201, such that all comparators 201 may operate essentially at the same operating point.

The text below makes reference to FIG. 8 to describe an analog-to-digital converter 800 based on an alternative exemplary embodiment of the invention.

Analog-to-digital converter 800 is set up to process a differential input signal 706, 707. The nonreactive resistors 801 in FIG. 8 replace the nonreactive resistors 701 to 705 from FIG. 7. The differential input voltages $V_{in+}$ and $V_{in-}$ 706, 707 illustrated in FIG. 8 are shifted by means of two resistor networks (the top chain of nonreactive resistors 801 illustrated in FIG. 8 or the bottom chain of nonreactive resistors 801 illustrated in FIG. 8) such that all comparators 201 operate essentially at the same operating point.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An analog-to-digital converter for converting a signal to be digitized into a digitized signal, comprising:
    a plurality of comparators, each of which has a first and a second input, and an output, wherein the output can be used to provide the digitized signal; and
    an impedance network for each comparator, wherein each impedance network is connected between at least one input on the associated comparator and the signal to be digitized and wherein each impedance network is connected between the associated comparator and a first electrical reference potential, and wherein at least some of the impedance networks have a first nonreactive resistor and a second nonreactive resistor, the first nonreactive resistor being connected between the first input and the second input of at least some of the comparators, and the second nonreactive resistor being connected between the first input of at least some of the comparators and the signal to be digitized;
    wherein the impedance networks are configured such that the comparators are brought essentially to the same operating point.

2. The analog-to-digital converter of claim 1, wherein the second input of at least some of the comparators is brought to a second electrical reference potential.

3. The analog-to-digital converter of claim 2, wherein the second electrical reference potential is the ground potential.

4. The analog-to-digital converter of claim 1, wherein at least some of the impedance networks have a voltage divider.

5. The analog-to-digital converter of claim 4, wherein the voltage divider has a first impedance which is connected between the first input and a third electrical reference potential.

6. The analog-to-digital converter of claim 5, wherein the first impedance is a third nonreactive resistor and the second impedance is a fourth nonreactive resistor and wherein the first impedance is a first capacitance and the second impedance is a second capacitance.

7. The analog-to-digital converter of claim 6, wherein the third electrical reference potential is the electrical ground potential.

8. The analog-to-digital converter of claim 4, wherein the voltage divider has a second impedance which is connected between the first input and the first electrical reference potential.

9. The analog-to-digital converter of claim 5, wherein the first electrical reference potential is split into a first potential part and into a second potential part, with a first portion of the comparators having at least some of their impedance network connected between the first input and the first potential part, and with a second portion of the comparators having at least some of their impedance network connected between the first input and the second potential part.

10. The analog-to-digital converter of claim 9, wherein the second and the third electrical reference potential has a value between the first and the second potential part.

11. The analog-to-digital converter of claim 5, wherein at least some of the comparators have a calibration device configured such that it can be used to correct a parameter fluctuation between different comparators.

12. The analog-to-digital converter of claim 11, wherein the calibration device has a switching element between the first input and the impedance network, such that the switching element can couple the first input to the impedance network in a detection mode and bring the first input to a fourth electrical reference potential in a calibration mode, a resultant signal at the output of the comparator being able to be taken as a basis for calibrating the comparator using the calibration device.

13. The analog-to-digital converter of claim 12, wherein the fourth electrical reference potential is the same as the second electrical reference potential.

14. The analog-to-digital converter of claim 13, wherein the value of at least one of the first to fourth nonreactive resistors is calculated, for at least some of the impedance networks, on the basis of the criterion that one of the first inputs of the comparators has a signal applied to it which is essentially the same as the second electrical reference potential.

15. The analog-to-digital converter of claim 14, wherein the value of at least one of the first to fourth nonreactive resistors is calculated, for at least some of the impedance networks, on the basis of the criterion that altering the signal to be digitized by a prescribable value results, for at least some of the comparators, in an alteration to the electrical potential at their first input by an essentially equal value.

16. The analog-to-digital converter of claim 15, wherein the value of at least one of the first to fourth nonreactive resistors is calculated, for at least some of the impedance networks, on the basis of the criterion that the nonreactive output resistance of at least some of the impedance networks is essentially the same.

17. An analog-to-digital converter for converting a signal to be digitized into a digitized signal, comprising:
  a plurality of comparators, each of which has a first and a second input and an output, wherein the output can be used to provide the digitized signal; and
  an impedance network for each comparator, wherein each impedance network is connected between at least one input on the associated comparator and the signal to be digitized and wherein each impedance network is connected between the associated comparator and a first electrical reference potential;
wherein the impedance networks are configured such that the comparators are brought essentially to the same operating point, and wherein at least some of the comparators have the respective associated impedance network containing a first impedance device part coupled to the first input and a second impedance device part coupled to the second input, wherein the signal to be digitized is split into a first and a second signal part to be digitized and the first electrical reference potential is split into a first potential part and a second potential part, and wherein the first impedance device part is connected between the first input, the first signal part to be digitized and the first potential part, and the second impedance device part is connected between the second input, the second signal part to be digitized and the second potential part.

18. The analog-to-digital converter of claim 17, wherein the first and second signal parts to be digitized are differential signals.

19. The analog-to-digital converter of claim 18, wherein the first impedance device parts have a first nonreactive resistor and a second nonreactive resistor, the first nonreactive resistor being connected between the first input and the first electrical potential part, and the second nonreactive resistor being connected between the first input and the first signal part to be digitized, and wherein the second impedance device parts have a third nonreactive resistor and a fourth nonreactive resistor, the third nonreactive resistor being connected between the second input and the second electrical potential part, and the fourth nonreactive resistor being connected between the second input and the second signal part to be digitized.

20. The analog-to-digital converter of claim 19, wherein at least one fifth nonreactive resistor is connected between the first and second inputs.

21. The analog-to-digital converter of claim 20, wherein the fifth nonreactive resistor is split into a first and into a second resistor part, with a connection between the first and second resistor parts being brought to a fifth electrical reference potential.

* * * * *